United States Patent
Koduri et al.

(10) Patent No.: US 6,734,532 B2
(45) Date of Patent: May 11, 2004

(54) BACK SIDE COATING OF SEMICONDUCTOR WAFERS

(75) Inventors: Sreenivasan K. Koduri, Plano, TX (US); Kenji Masumoto, Hiji Oita (JP); Mutsumi Masumoto, Beppu Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 316 days.

(21) Appl. No.: 10/006,576

(22) Filed: Dec. 6, 2001

(65) Prior Publication Data

US 2003/0109082 A1 Jun. 12, 2003

(51) Int. Cl.⁷ .............................. H01L 23/58
(52) U.S. Cl. ................ 257/632; 257/783; 438/778
(58) Field of Search ............................. 257/632, 783, 257/787, 701, 778, 432, 437, 431; 438/127, 778

(56) References Cited

U.S. PATENT DOCUMENTS 5,083,191 A * 1/1992 Ueda .......................... 257/783
6,013,953 A * 1/2000 Nishihara et al. ........... 257/778
6,023,094 A * 2/2000 Kao et al. ................... 257/632
6,400,037 B1 * 6/2002 Omizo ........................ 257/797
6,582,994 B2 * 6/2003 Jiang et al. ................. 438/127
6,650,022 B1 * 11/2003 Qi et al. ..................... 257/797

* cited by examiner

*Primary Examiner*—Sheila V. Clark
(74) *Attorney, Agent, or Firm*—Yingsheng Tung; Wade James Brady, III; Frederick J. Telecky, Jr.

(57) ABSTRACT

A semiconductor device comprising a semiconductor chip having an active and a passive surface; the active surface includes an integrated circuit and input/output pads suitable for metallurgical contacts. Further, the device has a protective plastic film (polyimide, epoxy resin, or silicone) of controlled and uniform thickness (20 to 60 $\mu$m) selectively attached to the passive surface. The film is suitable to absorb light of visible and ultraviolet wavelengths, to remain insensitive to moisture absorption, and to exert thermomechanical stress on the chip such that this stress at least partially neutralizes the stress exerted by an outside part after chip assembly.

20 Claims, 2 Drawing Sheets

BACK SIDE COATING OF SEMICONDUCTOR WAFERS

FIELD OF THE INVENTION

The present invention is related in general to the field of electronic systems and semiconductor devices, and more specifically to materials and fabrication methods of back side coating of semiconductor wafers and the application in flip-chip assembly.

DESCRIPTION OF THE RELATED ART

The large majority of semiconductor devices are manufactured by attaching the passive surface of an integrated circuit (I/C) chip to a metallic leadframe, bonding the chip input/output (I/O) pads on the active surface to the leadframe leads with connecting wires, and encapsulating the assembly, including the sensitive wires, in molding compound. The leadframe for semiconductor devices and the transfer molding technique have been invented by U.S. Pat. No. 3,716,764, issued on Feb. 13, 1973 (Birchler et al., "Process for Encapsulating Electronic Components in Plastic") and U.S. Pat. No. 4,043,027, issued on Aug. 23, 1977 (Birchler et al., "Process for Encapsulating Electronic Components in Plastic").

On the other hand, semiconductor chips assembled "face-down" (active surface down) onto a substrate using solder balls, do not necessarily need a protective encapsulation, since there are no sensitive connecting wires to be protected. However, other reliability risks related to this "flip-chip" assembly as well as the requirements for special I/O pad metallizations, have been described in a series of detailed publications by the International Business Machines Corporation in 1969 (IBM J. Res. Develop., Vol. 13, pp. 226–296): P. A. Totta et al., SLT Device Metallurgy and its Monolithic Extension, L. F. Miller, Controlled Collapse Reflow Chip Joining, L. S. Goldmann, Geometric Optimization of Controlled Collapse Interconnections, K. C. Norris et al., Reliability of Controlled Collapse Interconnections, S. Oktay, Parametric Study of Temperature Profiles in Chips Joined by Controlled Collapse Techniques, B. S. Berry et al., Studies of the SLT Chip Terminal Metallurgy.

With the increasing demand to reduce the size and thickness of the semiconductor devices, current industry trend is to use the-bare silicon itself as the package. These "chip-size" packages (the extreme case of a "chip-scale" package) are usually bumped on the I/O pads to provide interconnections with the outside part (usually a printed circuit board). To keep the overall device thickness as low as possible, these devices are generally not molded or encapsulated in the traditional sense. However, in order to achieve some level of protection, liquid or viscous compounds have been applied to the exposed surfaces by screen printing or spinning. For these processes, specialized equipment and controls are needed to achieve sufficient product control, which, in turn, results in substantial equipment and process cost.

When unprotected devices are mounted on a printed circuit board (PCB) with the active chip surface down (flip-chip mounting), the bare passive chip surface of the device is exposed to the elements. Since semiconductor materials such as silicon are photo-sensitive, the exposure to ambient light of the passive chip surface can produce undesirable electrical noise, especially when the chip itself is thin.

An urgent need has, therefore, arisen for a coherent, low-cost method of protecting passive surface of the semiconductor chip from the ambient light. The challenge of cost reduction implies a drive for minimizing the number of process steps, and the application of standardized materials and process conditions wherever possible. The device structure should further enhance mechanical stability and high reliability. The fabrication method should be simple and suitable for batch processing, yet flexible enough for different semiconductor product families and a wide spectrum of design and process variations. Preferably, these innovations should be accomplished with minimum extension of product cycle time, and using installed equipment, so that no investment in new manufacturing machines is needed.

SUMMARY OF THE INVENTION

The present invention describes a semiconductor device comprising a semiconductor chip having an active and a passive surface; the active surface includes an integrated circuit (I/C) and input/output (I/O) pads suitable for metallurgical contacts. Further, the device has a protective plastic film of controlled and uniform thickness selectively attached to the passive surface. The film is suitable to absorb light of visible and ultraviolet wavelengths, to remain insensitive to moisture absorption, and to exert thermomechanical stress on the chip such that this stress at least partially neutralizes the stress exerted by an outside part after chip assembly.

The plastic film is selected from a group of electrically insulating materials consisting of polyimide, epoxy resin, and silicone, and the film further includes hardener, tackyfier, and fillers.

The film thickness preferably ranges from 20 to 60 $\mu$m, the light absorption is at least 96%, and the neutralizing stress is provided by a film coefficient of thermal expansion (CTE, about 18 to 45 ppm/° C.) approximately matching the CTE of the outside part, such as a printed wiring board. After curing the film has an adhesion strength of about 400 kg/cm$^2$ and a modulus of about 16 GPa.

The film is rolled onto the passive surface of the whole semiconductor wafer and cured at elevated temperatures, preferably about 150° C., for a length of time of about 1 hr. After film hardening, the wafer sawing process is applied to semiconductor and film material concurrently in order to singulate the individual chips.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. TI-33535, filed on Nov. __, 2001 (Zuniga-Ortiz et al., "Bumpless Wafer-Scale Device and Board Assembly"), which is herewith incorporated by reference.

Figure 1:
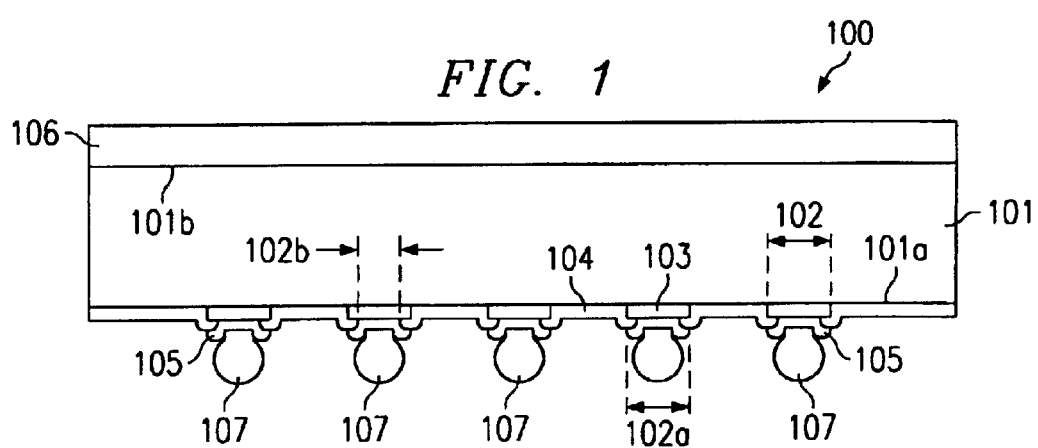
FIG. 1 is a schematic cross section of a semiconductor chip having a protective plastic film attached to the passive chip surface according to the invention.

The schematic cross section of FIG. 1 illustrates an embodiment of the present invention, which summarizes the innovative features. A semiconductor device, generally designated 100, comprises a semiconductor chip 101, which has an active surface 101a including an integrated circuit (I/C) and a passive surface 101b. The integrated circuit includes input/output (I/O) pads 102, which are suitable for metallurgical contacts 102a.

While the semiconductor chip 101 is commonly silicon, the invention is limited to silicon. The semiconductor material may also be silicon germanium, gallium arsenide, or any other semiconductor material used in I/C fabrication.

The I/C has a metallization pattern 103 including the plurality of contact pads 102. The chip metallization 103 may consist of aluminum, copper, or alloys thereof. The IC surface is protected by a dielectric protective overcoat 104, usually silicon nitride of about 1 $\mu$m thickness. As FIG. 1 illustrates, the photoresist window defining contact pad 102b has been opened through the protective overcoat 104.

When layer 103 is aluminum or aluminum alloyed with 0.5 to 2% copper and/or 0.5 to 1% silicon (layer 0.4 to 1.5 $\mu$m thick), the contact pad exhibits under the aluminum frequently a thin layer (4 to 20 nm thick) of titanium, titanium nitride, titanium tungsten, tantalum, tantalum nitride, tantalum silicon nitride, tungsten nitride, or tungsten silicon nitride (not shown in FIG. 1).

For aluminum as well as copper chip metallization, the insulator under the metallization is typically silicon dioxide. However, with the recent trend towards dielectric materials of lower dielectric constants, films made of silicon-containing hydrogen silsesquioxane (HSQ), aerogels, organic polyimides and parylenes are also used in spite of the fact that they are less dense and mechanically weaker than previous standard insulators such as the plasma-enhanced chemical vapor deposited dielectrics. Also, stacks of dielectric layers may be used such as alternating layers of plasma-generated tetraethylorthosilicate (TEOS) oxide and HSQ, or ozone TEOS oxide and HSQ.

In order to strengthen the chip contact pad mechanically, reinforcing structures are sometimes placed under the bonding pad (not shown in FIG. 1). Descriptions may be found in U.S. Pat. No. 6,1443,396, issued Nov. 7, 2000 (Saran et al., System and Method for Reinforcing a Bond Pad), and U.S. Pat. No. 6,232,662, issued May 15, 2001 (Saran, System and Method for Bonding over Active Integrated Circuits), and U.S. patent application Ser. No. 09/312,385, filed May 14, 1999 (Saran et al., "Fine Pitch System and Method for Reinforcing Bond Pads in Semiconductor Devices").

In the embodiment of FIG. 1, the contact pad has an added conductive layer 105 on the pad metallization 103. This layer 105 is conformal to the surface of the chip and provides a reliable, low resistance contact to the pad metallization 103. As FIG. 1 shows, layer 105 covers not only the area of the pad 102b proper, but also the window side walls of protective layers 104 and a portion of the surface surrounding the pad window. The preferred material for layer 105 is a so-called under-bump metallization, which has been investigated in numerous literature publications. For instance, reliability risks, as well as the requirements for special pad metallizations, have been described in a series of detailed publications by the International Business Machines Corporation in 1969 (IBM J. Res. Develop., Vol. 13, pp. 226–296): P. A. Totta et al., SLT Device Metallurgy and its Monolithic Extension, L. F. Miller, Controlled Collapse Reflow Chip Joining, L. S. Goldmann, Geometric Optimization of Controlled Collapse Interconnections, K. C. Norris et al., Reliability of Controlled Collapse Interconnections, S. Oktay, Parametric Study of Temperature Profiles in Chips Joined by Controlled Collapse Techniques, B. S. Berry et al., Studies of the SLT Chip Terminal Metallurgy.

The I/O pads 102 in FIG. 1 have a metallization 105 suitable for attachment to outside parts either by forming welds under thermocompression bonding, or solder connections under reflow conditions (using solder material 107, preferably solder "balls", or adhesive connections under adhesive attachment (using electrically conductive adhesives).

An important feature of the present invention is protective plastic film 106 of controlled and uniform thickness, which is selectively attached to passive chip surface 101b. Suitable films are commercially available; examples include NEX-130C from Nippon Steel, Japan; CNB-768-35 from Dexter, USA; CEL-C-4100F from Hitachi, Japan; and CEL-C-7240 from Hitachi, Japan. The films are selected from a group of electrically insulating materials including polyimide, epoxy resin, and silicone. These films are adhesive only on one side, namely the side to be attached to the passive semiconductor chip surface. The film thickness ranges usually from 20 to 60 $\mu$m, with preferred thicknesses being 25 $\mu$m and 50 $\mu$m.

The most outstanding film characteristic is its light absorbing capability in the visible and infrared wavelengths regimes. Furthermore, the film remains insensitive to moisture absorption, and exerts thermomechanical stress on the chip such that this stress at least partially neutralizes the stress exerted by an outside part (such as a printed circuit board) after chip assembly.

As examples, some characteristics of the films LE-5000X of Lintec, and-NEX-930L of Nippon Steel are tabulated in TABLE 1.

TABLE 1

|  | LE-5000X |  | NEX-930L |
| --- | --- | --- | --- |
| Thickness | 25 $\mu$m | 50 $\mu$m | 50 $\mu$m |
| Filler | No | Yes (70%) | Yes (70%) |
| Color | Black/Blue | Black | Black |
| Carbon % | 1.3/0.65 | 1.3/0.65 | 0.34/0.73 |
| Warpage | Good | Good | Good |
| Dicing | Good | Good | Good |

Figure 2:
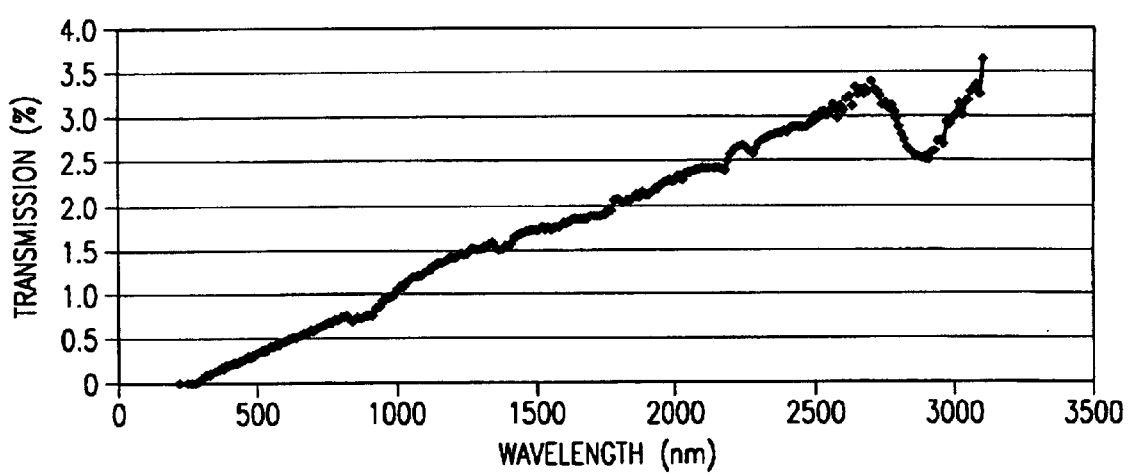
FIG. 2 is an example of light absorption data (in %) as a function of light wavelength (in nm); the data are measured for the plastic film LE-5000X manufactured by the company Intec, Japan.

As an example for the light absorption, FIG. 2 plots the light transmission data (in %) measured as a function of light wavelength (in nm) for the Lintec LE-5000X for the thickness of 50 $\mu$m. As the plot shows, the light penetration ratio is less than 4% for all samples.

Figure 3:
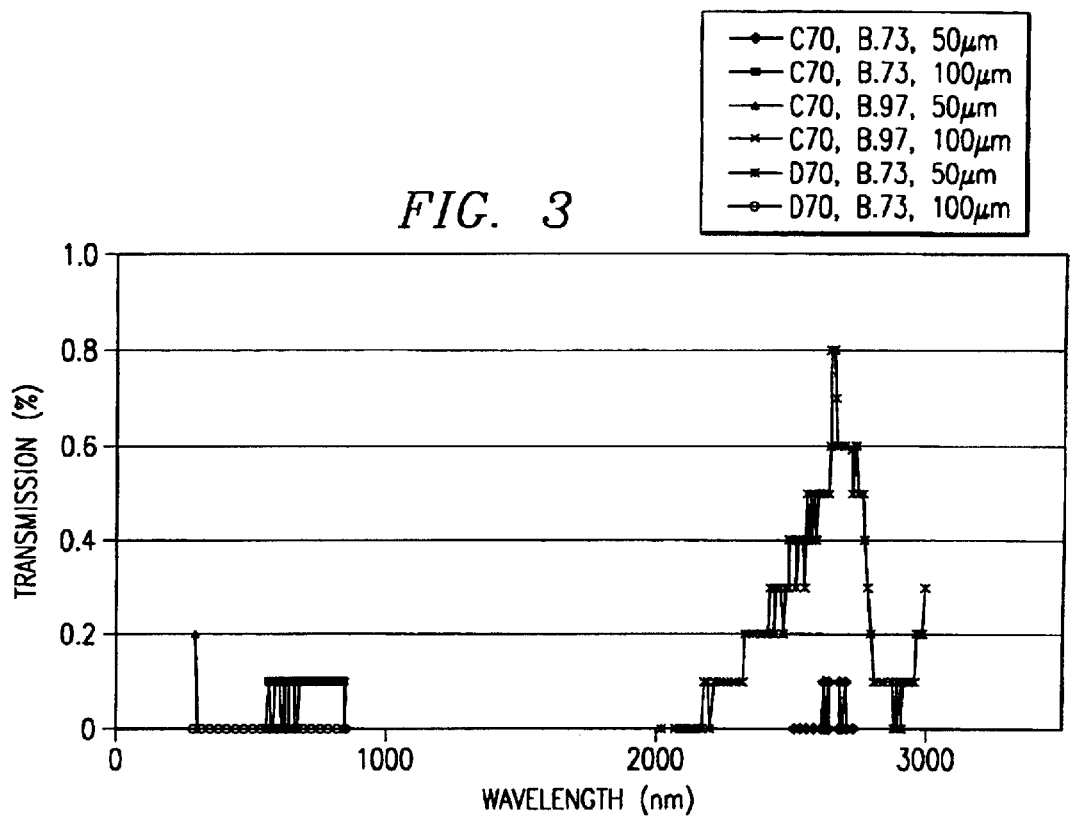
FIG. 3 is an example of light absorption data (in %) as a function of light wavelength (in nm); the data are measured for the plastic film NEX-930L manufactured by the company NSC, Nippon Steel Chemical, Japan.

Similarly, FIG. 3 plots the light transmission data (in %) measured as a function of light wavelength (in nm) for the Nippon Steel film NEX-930L in the thicknesses of 50 and 100 μm. As the plot shows, the light penetration ratio is less than 1% for all samples, and differences between filler or carbon contents of the film variations are minimal and barely distinguishable on the scale of the plot.

It is a technical advantage of the present invention that the neutralizing stress provided by the film can be achieved by a film selected for two suitable parameters: thickness, and coefficient of thermal expansion (CTE). Preferably, the film CTE is approximately matching the CTE of the outside part, such as a printed wiring board. A preferred range of CTE is about 18 to 45 ppm/° C., coupled with a flexural modulus of about 16 to 19 GPa. Examples of suitable film characteristics, offered by several film manufacturers, are listed in TABLE 2.

TABLE 2

|  | (Star Film) Nippon Steel NEX-130C | Dexter CNB768-35 | Hitachi CEL-C-4100F | Hitachi CEL-C-7240 |
|---|---|---|---|---|
| Density (g/cc) | 1.77 |  |  |  |
| Tg (C) | 165 | 145–170 | 64 | 96 |
| Ef (GPa) | 16 |  | 0.9 | 19.4 |
| Flex Str (MPa) | 130 |  |  |  |
| a1 (ppm/C) | 19 | 11 | 130 | 12 |
| a2 (ppm/C) | 45 | 20 |  | 42 |
| Vol. Res. (ohm*cm) | 5.00E+16 |  |  |  |
| Water Abs. (%) | 0.85 |  | 0.5 | 0.35 |
| Cl− (ppm) | 70 |  | 4.3 | 1.1 |
| Na+ (ppm) | 3 |  | 1.5 | 0.9 |
| Pot life (hr) | N/A |  | 24 | 8 |
| Cure (C*hr) |  | 165*0.5 | 120*1 + 150*3 | 130*1 + 180*3 |

The effect of film 106 in FIG. 1 to reduce stress on the joints of the I/O pads with the outside part can be supported by the configuration of the I/O pads. (The stress reduction can be achieved whether the joint is by direct contact with metallization 105, or solder balls 107 are used). The I/O pads on the active chip surface should preferably be configured in proximity to the stress-neutral central chip portion and distant from the stress-maximum peripheral chip portions. The pad positioning in the stress-neutral central chip portion minimizes any stress caused by the CTE difference of an outside part, such as a printed wiring board made of materials like FR-4, FR-5 and BT resin (with or without strengthening or thermally modulating fibers), relative to the CTE of silicon. The stress-mitigating influence of film 106 can thus become particularly pronounced. If possible, the CTE of the outside part should be selected to be approximately matching the CTE of plastic film 106.

In order to give a more detailed example, the film material NEX-130C, commercially offered by Nippon Steel Chemical Co., Japan, is listed in TABLE 3. Notable among the film parameters is an adhesion strength to the passive chip surface of about 400 kg/cm² after curing, and a moisture absorption of about 0.85 weight % without changing any film properties.

TABLE 3

| ITEM | UNIT | STANDARD | TOLERANCE |
|---|---|---|---|
| Working Properties |  |  |  |
| Viscosity @ 150 deg. C. | Poise | 350 | +−150 |
| Cure Time @ 180 deg. C. | sec. | 160 | +−30 |

TABLE 3-continued

| ITEM | UNIT | STANDARD | TOLERANCE |
|---|---|---|---|
| Physical Properties |  |  |  |
| Specific Gravity |  | 1.77 | +−0.05 |
| Thermal Expansion, Alpha-1 | ppm | 19 | +−5 |
| Thermal Expansion, Alpha-2 | ppm | 45 | +−15 |
| Glass Transition Temperature | Deg. C. | 165 | +−15 |
| Flexural Strength | MPa | 130 | +−40 |
| Flexural Modulus | MPa | 16000 | +−2000 |
| Heat Conductivity | W/mK | 0.6 | +−0.1 |
| Water Absorption | wt % | 0.85 | +−0.15 |
| Adhesion Strength, Cured @ 150 deg. C., 1 hr. | kg/cm² | 400 | +−150 |
| Heat Decomposition Temp. | deg. C. | 340 | +−25 |
| Electric Properties |  |  |  |
| Volume Resistance | ohm*cm | 5E+16 | +− 4E+16 |
| Dielectric Constant |  | 3.7 | +−0.3 |
| Dielectric Loss |  | 0.010 | +−0.002 |
| Chemical Properties |  |  |  |
| Ionic Chloride Content | ppm | 70 | +−70 |
| Ionic Sodium Content | ppm | 3 | +−3 |
| Working Properties (Reference) |  |  |  |
| Provisional Adhesive Strength*[1] | kg/cm² | min. 5 |  |

*[1]"Provisional Adhesive Strength" is a new determination item.

Further detail about the raw material components of the selected example material NEX-130C is tabulated in TABLE 4. Especially noteworthy is the content of about 4% amine type hardener; about 5% thermoplastic resin tackyfier; and fillers of two kinds, about 50 to 60% larger particle size silica, and about 12 to 15% smaller particle size silica.

TABLE 4

| Entity | Name of Raw Material | Percentage |
|---|---|---|
| Epoxy resin | Solid epoxy resin | 15.2% |
|  | Liquid epoxy resin | 5.1% |
| Hardener | Amine type | 4.0% |
| Catalyst | Imidazol type | 0.4% |
| Tackyfier | Thermo plastic resin | 5.1% |
| Coupling agent | Epoxy silane | 0.5% |
| Additive | Silicone intermediate | 0.3% |
| Fillers | Larger particle size silica | 55.5% |
|  | Smaller particle size silica | 13.9% |
|  | Total | 100.0% |

It should be noted that the percentages quoted are variable; they are intended to indicate value ranges rather than fixed numbers.

As another characteristic, it is advantageous that the film, after curing, can be clearly marked by a laser for inscribing information such as product type, manufacturer, date, origin etc.; the above quoted example material NEX-130C has this characteristic.

FIGS. 4A, 4B, 5A, 5B, 6 and 7 illustrate in simplified manner the process flow for completing the fabrication of a semiconductor device according to the invention.

Figure 4A:
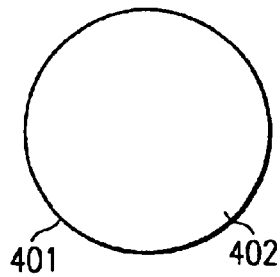
FIG. 4A is a schematic top view of the passive surface of a semiconductor wafer.
Figure 4B:
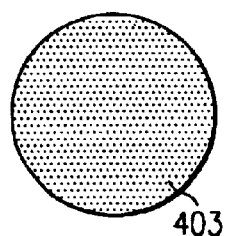
FIG. 4B is a schematic top view of the light-absorbing plastic film as used by the invention.
Figure 5A:
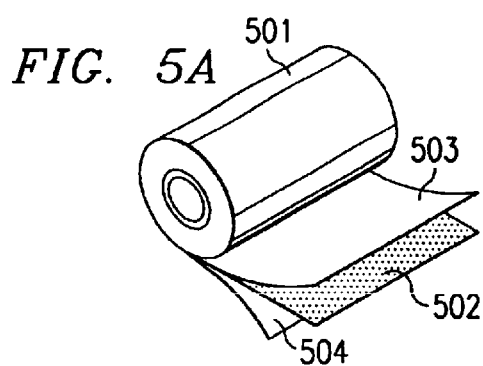
FIG. 5A is a schematic perspective view of a roll of plastic film with its two disposable cover sheets as employed by the invention.
Figure 5B:
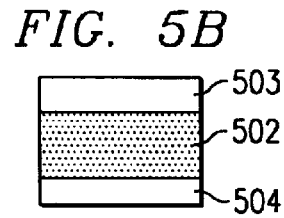
FIG. 5B is a schematic cross section of the plastic film and its two cover sheets before disposal of the cover sheets.

FIG. 4A: Providing a semiconductor wafer 401 having an active surface (not shown in FIG. 4A) and a passive surface 402; the active surface includes a plurality of chips having I/Cs and I/O pads suitable for metallurgical contacts;

FIG. 4B: providing a suitable length of adhesive plastic film 403 of controlled and uniform thickness, this film suitable to absorb light of visible and infrared wavelengths, to remain insensitive to moisture absorption, and to exert thermomechanical stress on the chips such that the stress at least partially neutralizes the stress exerted by an outside part after chip assembly. Film 403 is provided from a large roll 501, as depicted in FIG. 5A. Since the film 502 is adhesive on one of its surfaces, it is supplied with cover sheets 503 and 504 on its two surfaces, respectively.

Figure 6:
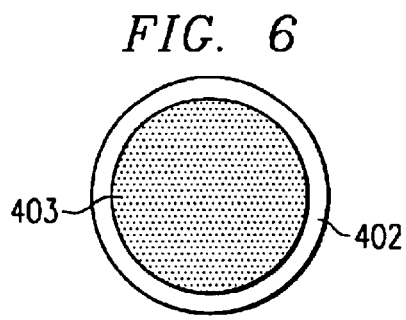
FIG. 6 is a schematic top view of the semiconductor wafer after the process step of attaching the light-absorbing plastic film.
Figure 7:
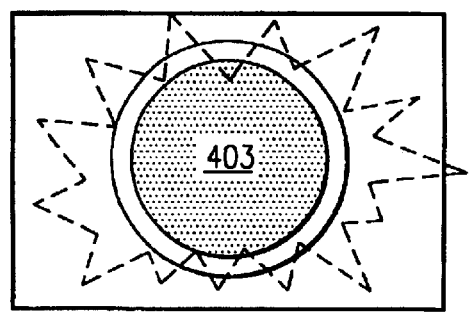
FIG. 7 is a schematic representation of the process step of curing the film-covered wafer in a curing oven.

FIG. 6: rolling the film 403 onto the passive wafer Surface 402;

FIG. 7: curing the film 403 at elevated temperatures for a length of time sufficient to increase the adhesion strength between film 403 and the wafer 401 to a predetermined value; preferably, the curing temperature is about 150° C., and the length of time about 1.0 hr.; and singulating the chips of the wafer by sawing the wafer 401 through the semiconductor as well as though the adhering film 403 (step of singulation not shown in FIG. 7).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

We claim:

1. A semiconductor device comprising:
    a semiconductor chip having an active and a passive surface, said active surface including an integrated circuit (I/C) and input/output (I/O) pads suitable for metallurgical contacts; and
    a protective plastic film of controlled and uniform thickness selectively attached to said passive surface, said film suitable to absorb light of visible and infrared wavelengths, to remain insensitive to moisture absorption, and to exert thermomechanical stress on said chip such that said stress at least partially neutralizes the stress exerted by an outside part after chip assembly.

2. The device according to claim 1 wherein said light absorption is more than 96% for all wavelengths.

3. The device according to claim 1 wherein said neutralizing stress is provided by a film selected for suitable thickness and a coefficient of thermal expansion (CTE) approximately matching the CTE of said outside part.

4. The device according to claim 3 wherein said film thickness is in the range from 20 to 100 $\mu$m.

5. The device according to claim 3 wherein said film has a CTE between about 18 and 45 ppm/° C. and a flexural modulus of about 16 GPa.

6. The device according to claim 1 wherein said film is attached to said chip with an adhesion strength of about 400 kg/cm$^2$ after curing.

7. The device according to claim 1 wherein said moisture absorption is about 0.85 weight %.

8. The device according to claim 1 wherein said plastic film is selected from a group of electrically insulating materials consisting of polyimide, epoxy resin, and silicone, and said film further including hardener, tackyfier, and fillers.

9. The device according to claim 8 wherein said hardener is about 4% amine type.

10. The device according to claim 8 wherein said tackyfier is about 5% thermoplastic resin.

11. The device according to claim 8 wherein said fillers include 50 to 60% larger particle size silica, and 12 to 15% smaller particle size silica.

12. The device according to claim 1 wherein said film further can be marked by laser or ink inscribing.

13. The device according to claim 1 wherein said I/O pads on said active chip surface are configured in proximity to the stress-neutral central chip portion and distant from the stress-maximum peripheral portions.

14. The device according to claim 1 wherein said I/O pads have a metallization suitable for attachment to outside parts either by forming welds under thermocompression bonding, or solder connections under reflow conditions, or adhesive connections under adhesive attachment.

15. An assembly of a semiconductor device onto an outside part comprising:
    a semiconductor chip having active and passive surfaces, said active surface including an I/C and I/O pads suitable for metallurgical contacts;
    a protective plastic film of controlled and uniform thickness selectively attached to said passive surface, said film suitable to absorb light of visible and infrared wavelengths, to remain insensitive to moisture absorption, and to exert thermomechanical stress on said chip such that said stress at least partially neutralizes the stress exerted by an outside part after chip assembly;
    an outside part, integral with electrically conductive interconnection lines in an insulating body and metallized terminals aligned with said chip I/O pads; and
    said chip I/O pads electrically connected to said aligned metallized terminals of said outside part.

16. The assembly according to claim 15 wherein said electrical connection is selected from a group of techniques and materials comprising:
    direct welding by metallic interdiffusion;
    attachment by solder paste; and
    attachment by conductive adhesive.

17. The assembly according to claim 15 wherein said outside
    part is an assembly board selected from a group of organic material including FR-4, FR-5, and BT resin, with or without strengthening or thermally modulating fibers; metals; and ceramics.

18. The assembly according to claim 17 wherein the CTE of said outside part is selected to be approximately matching the CTE of said plastic film.

19. A method for completing the fabrication of a semiconductor device, comprising the steps of:
    providing a semiconductor wafer having an active and a passive surface, said active surface including a plurality of chips having I/Cs and I/O pads suitable for metallurgical contacts;
    providing a suitable length of adhesive plastic film of controlled and uniform thickness, said film suitable to absorb light of visible and infra-red wavelengths, to remain insensitive to moisture absorption, and to exert thermomechanical stress on said chips such that said stress at least partially neutralizes the stress exerted by an outside part after chip assembly;
    rolling said film onto said passive wafer surface;
    curing said film at elevated temperatures for a length of time sufficient to increase the adhesion strength between said film and said wafer to a predetermined value; and
    singulating said chips by sawing said wafer through said semiconductor and said adhering film.

20. The method according to claim 19 wherein said curing comprises a temperature of about 150° C. and a length of time of about 1.0 hr.

* * * * *